United States Patent
Wheeler et al.

(10) Patent No.: US 6,228,745 B1
(45) Date of Patent: May 8, 2001

(54) SELECTIVE REDUCTION OF SIDEWALL SLOPE ON ISOLATION EDGE

(75) Inventors: Donald C. Wheeler, Beacon; Louis L. Hsu, Fishkill; Jack A. Mandelman, Stormville; Rebecca D. Mih, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,134

(22) Filed: Dec. 13, 1999

Related U.S. Application Data

(63) Continuation of application No. 08/820,400, filed on Mar. 12, 1997, now abandoned.

(51) Int. Cl.[7] ................................................ H01L 21/76
(52) U.S. Cl. .............................. 438/424; 430/5; 430/325; 438/947
(58) Field of Search .................................. 438/424, 947; 430/5, 325

(56) References Cited

U.S. PATENT DOCUMENTS

| | | |
|---|---|---|
| 4,051,506 | 9/1977 | Horie . |
| 4,255,207 | 3/1981 | Nicolay et al. . |
| 4,258,465 | 3/1981 | Yasui et al. . |
| 4,329,186 | 5/1982 | Kotecha et al. . |
| 4,419,809 | 12/1983 | Riseman et al. . |
| 4,599,118 | 7/1986 | Han et al. . |
| 4,689,656 | 8/1987 | Silvestri et al. . |
| 4,763,183 | 8/1988 | Ng et al. . |
| 4,863,562 | 9/1989 | Bryant et al. . |
| 5,059,550 | 10/1991 | Takeoka et al. . |
| 5,159,419 | 10/1992 | Hosack . |
| 5,177,571 | 1/1993 | Satoh et al. . |
| 5,225,035 | 7/1993 | Rolfson . |

(List continued on next page.)

FOREIGN PATENT DOCUMENTS

| | | |
|---|---|---|
| 000073623 | 3/1983 | (EP) . |
| 000401537 | 12/1990 | (EP) . |
| 002081506A | 2/1982 | (GB) . |
| 359096768 | 6/1984 | (JP) . |
| 401099259 | 4/1989 | (JP) . |
| 403064931 | 3/1991 | (JP) . |

OTHER PUBLICATIONS

M. Nichighori et al, "Anomalous Hot–carrier Induced Degradation in Very Narrow Channel nMOSFETs with STI Structure", 1996, IEDM.

Trench Etches in Silicon with Controllable Sidewall Angles, Carlie et al.; D.C. Look, IEEE Trans. Electron Devices, ed —35, 133; 1988.

Silicon Processing for the VLSI Era Volume:2 Stanley Wolf Ph.D California State University, Long Beach, California pp. 46–47.

(List continued on next page.)

Primary Examiner—Long Pham
(74) Attorney, Agent, or Firm—Daryl K. Neff

(57) ABSTRACT

Disclosed is a semiconductor structure which comprises a transistor having a source implantation and a drain implantation formed in a semiconductor substrate. The transistor further comprises a gate electrode, a gate oxide, and an active area. The source implantation and drain implantation are situated on opposite sides of said active area, and said gate oxide and gate electrode are situated on top of said active region. The transistor further comprises two trench isolations adjacent to said active area, wherein said trench isolations are situated on opposite sides of said active area such that a sidewall of each trench serves as interface to said active area, at least one of said sidewalls of said trench isolations which serves as interface to said active area being sloped having a slope between 90° and 150°, said trench isolations and source implantation and drain implantation enclosing said active area on four sides.

4 Claims, 6 Drawing Sheets

U.S. PATENT DOCUMENTS

| | | |
|---|---|---|
| 5,225,697 | 7/1993 | Malhi et al. . |
| 5,234,852 | 8/1993 | Liou . |
| 5,300,379 | 4/1994 | Dao et al. . |
| 5,300,786 | 4/1994 | Brunner et al. . |
| 5,302,477 | 4/1994 | Dao et al. . |
| 5,308,722 | 5/1994 | Nistler . |
| 5,328,784 | 7/1994 | Fukuda . |
| 5,348,826 | 9/1994 | Dao et al. . |
| 5,368,962 | 11/1994 | Kiryu et al. . |
| 5,368,963 | 11/1994 | Hanyu et al. . |
| 5,370,975 | 12/1994 | Nakatani . |
| 5,487,962 | 1/1996 | Rolfson . |
| 5,518,945 | 5/1996 | Braccjotta et al. . |
| 5,521,422 | 5/1996 | Mandelman et al. . |
| 5,538,815 | 7/1996 | Oi et al. . |
| 5,547,789 | 8/1996 | Nakatani et al. . |
| 5,557,134 | 9/1996 | Sugisaka et al. . |
| 5,559,357 | 9/1996 | Krivokapic . |
| 5,567,553 | 10/1996 | Hsu et al. . |
| 5,567,635 | 10/1996 | Acovic et al. . |
| 5,643,822 | 7/1997 | Furnkawa et al. . |
| 5,672,450 | 9/1997 | Rolfson . |
| 5,718,829 | 2/1998 | Pierrat . |
| 5,767,549 | 6/1998 | Chen et al. . |
| 5,795,801 | 8/1998 | Lee . |
| 5,948,571 | 9/1999 | Mih et al. . |
| 5,994,202 | 11/1999 | Gambino et al. . |
| 6,015,991 | 1/2000 | Wheeler et al. . |

OTHER PUBLICATIONS

C–H. Hsu and D–S. Wen, "Method for Making Self–Aligned, Reverse–T Gate LDD MOSFET", IBM Technical Disclosure Bulletin, vol. 32, No. 3B, Aug. 1989, pp. 154–155.

Y. Taur and L. K. Wang, "Process for Fabricating Lightly Doped Drain MOS Devices with Punch–Through Stoppers", IBM Technical Disclosure Bulleting, vol. 27, No. 11, Apr. 1985, pp. 6622–6623.

M. Hargrove, E. Miersch, G. Pittman and D. Thomas, "Integrated SCHOTTKY Diode in CMOS", IBM Disclosure Technical Bulleting, vol. 28, No. 12, May 1986, pp. 5178–5179.

R. L. Mohler and S. S. Roth, "LDD Sidewall Spacers without Reactive Ion Etch". IBM Technical Disclosure Bulletin, vol. 27, No. 7B, Dec. 1984, pp. 4362–4364.

New Focus Metrology Technique Using Special Test Mask, Timothy A. Brunner, IBM Semiconductor Research and Development Center, Hopewell Junction, New York, 1994.

Simulations and Experiments With The Phase Shift Focus Monitor, T.A. Brunner & R.D. Mih, IBM Advanced Semiconductor Technology Center, Hopewell Junction, New York 12533, Feb., 1996.

Pending Patent Application Serial No. 08/681,104, Filed Jul. 22, 1996, Entitled "Improved Trench Isolated FET Device and Method for Their Manufacture".

Pending Patent Application Serial No. 08/788,065, Filed Jan. 23, 1997, Entitled "Threshold voltage tailoring of corner MOSFET device".

Pending Patent Application Serial No. 08/678,442, Filed Jul. 3, 1996, Entitled "SOI CMOS Structure".

SELECTIVE REDUCTION OF SIDEWALL SLOPE ON ISOLATION EDGE

This is a continuation of U.S. application Ser. No. 08/820,400, filed Mar. 12, 1997, now abandoned.

BACKGROUND OF THE INVENTION

1. Cross-reference to Related Patent Applications

This patent application is related to U.S. patent application Ser. No. 08/820,401 entitled "Asymmetrical Field Effect Transistor", and U.S. Pat. No. 5,948,571 entitled "Asymmetrical Resist Sidewall", both filed on the same day as the instant application and both being presently assigned to the assignee of the instant application and the disclosure of which is incorporated herein by reference. This application is further related to U.S. patent application Ser. No. 09/175,856 filed Oct. 20, 1998 entitled "Asymmetrical Resist Sidewall," the same being a Divisional application of said U.S. Pat. No. 5,948,571.

2. Field of the Invention

This invention relates to trench bounded transistors, and in particular trench bounded metal oxide semiconductor (MOS), or complentary metal oxide semiconductor (CMOS), or silicon on insulator (SOI), field effect transistors.

3. Description of Related Art

In electronic component manufacture and in particular integrated circuit silicon wafer manufacturing, the key factor in delineating small patterns in the wafer is the shape of the resist pattern. The following description will be directed to integrated circuit silicon wafer manufacture and silicon devices but it will be appreciated by those skilled in the art that the invention may be applied to the manufacture of other electronic components such as gallium arsenide circuits, component packages and printed circuit boards. In the manufacture of integrated circuit components such as semiconductors, electronic circuit pattern control, e.g., linewidth control is becoming increasingly important because of even higher integration of the circuits and the linewidth and other circuit patterns are required to be increasingly fine and precise. Pattern control in photolithographic processes, however, is negatively impacted by numerous effects ranging from resist thickness variations, bake non-uniformities, non-flat wafers, etc. Photolithography techniques are preferably used to form the fine resist pattern to define the circuit and, in general, a wafer, on which a resist having a predetermined thickness is applied, is positioned on a wafer stage and light from a light source passes through a photo mask having a predetermined mask (circuit) pattern thereon. The light passing through the photo mask is projected onto the resist on the wafer forming the mask pattern on the resist. The resists are typically negative resists or positive resists. The exposed resist is then processed using a number of cleaning, developing and etching steps to form a pattern on the wafer either in the form of openings in the resist which are to be metallized to form the desired circuit pattern (negative resist) or in the form of a positive resist pattern delineating the desired pattern on the wafer surface to be metallized. The above photolithographic process is shown in U.S. Pat. No. 5,300,786 which is assigned to the assignee of the present invention.

In either of the negative or positive resist methods or combination resist methods (e.g., image reversal resists), it is necessary that a photo mask be used to form the pattern on the resist and, traditionally, the imaging process using optical lithography creates a plurality of resist patterns which are each, in cross-section, of substantially constant width, height and symmetry. Under some exposure conditions, the width of the resist pattern may vary somewhat with the height of the resist with the width at the base being slightly wider than the width at the top of the resist. In any event, the resist pattern is still symmetrical and a metallized circuit line would be of essentially constant cross-section measured about a vertical axis extending upward from the midpoint of the base of the resist pattern.

There are many different integrated circuit manufacturing processes that require an asymmetric resist pattern as part of the process to provide desired circuit designs, and one application, for example, is to produce a pattern for lift off processes. These methods are well known in the art. A number of attempts have been made to create an asymmetrical resist (photoresist) profile or pattern. In U.S. Pat. No. 5,547,789 to Nakatani et al. an asymmetrical light intensity profile is used to pattern a positive resist, which resist is then converted by flood illumination into a negative resist (image reversal resist) in order to affect the placement of subsequently formed gate electrodes. The purpose of the asymmetry of the resist pattern is to create an asymmetrical placement of the gate electrode. The asymmetrical intensity profile is achieved by a pattern transfer mask comprised of a transfer substrate, a linear light shielding film pattern disposed on the transparent substrate, and a means for reducing the intensity of light transmitted through a part of the mask on either side of the light shielding film pattern. The pattern transfer mask comprises a transparent substrate having different kinds of light attenuating films placed on the transparent substrate next to the light shielding pattern such as an opaque material, a light shielding film with different thicknesses or a semi-transparent film. The resist profiles shown are strongly re-entrant on both sides of the pattern which is not acceptable for many manufacturing methods. Another patent which shows an asymmetrical light intensity profile is U.S. Pat. No. 5,370,975 to Nakatani wherein the mask designed to create the asymmetrical light profile employs a phase shifter with an edge angle ranging from 70°–85° or 9.5°–110° or the phase shifter is shaped to be smoothly curved. In U.S. Pat. No. 5,300,786, supra, there is a description of a phase shift mask which can shift the intensity profile of the light for the purpose of determining and controlling the focus settings of an optical lithography exposure system. When there is a change in focus, the minimum point of the intensity profile is shifted to create an asymmetrical displacement of the photoresist pattern to the left or right direction. The intensity profile is asymmetric about the minimum intensity peak point and it is the asymmetric peak shift which creates a pattern placement error which is used in conjunction with other reference patterns to measure the focus as an overlay by an automated overlay error measurement tool.

In U.S. Pat. No. 5,368,962 to Hanyu et al. a photo mask is shown comprising a light shielding layer formed on a mask substrate and light transmission areas defined on the mask substrate by the light shielding areas. The light transmitting areas are divided with phase shifters.

The above patents are hereby incorporated by reference.

There are various devices known which make use of trenches (also referred to as trench-bounded structures) to provide for a separation and/or isolation of adjacent circuits. Such trench-bounded structures are employed in CMOS logic and memory products fabricated in either bulk or SOI substrates. The presence of the semiconductor corner in the active device region (active area) of a surface-channel trench bounded MOSFET, for example, results in a parasitic leakage current between source and drain diffusions. It has been found that the leakage current along the corner of the MOSFET results from a local lowering of the threshold voltage, due to the geometry of the device. The leakage current is the residual source to drain current when it is desired that the device be non-conducting (off condition), typically at $V_{gs}=0$. The electric field at the semiconductor corner is enhanced by its small radius of curvature, resulting in reduced a corner threshold voltage. In addition to increased leakage current, the enhanced corner electric field results in degraded device reliability. The portion of the semiconductor substrate containing the MOSFET (exclusive of the bounding trenches) is referred to as the active area.

It has been discovered that the device off-current is sensitive to the sidewall angle of the active area. Trench bounded MOSFETs typically have sidewall angles close to 90° (vertical sidewall).

An example of such a device, namely a SOI CMOS structure with shallow trench isolation is addressed in U.S. Pat. No. 5,767,549, filed Jul. 3, 1996, entitled "SOI CMOS Structure" which is assigned to the assignee of the present application. This patent is incorporated by reference in the present application.

Degradation of MOSFETs with conventional trench interfaces are addressed in "Anomalous Hot-carrier Induced Degradation in Very Narrow Channel nMOSFETs with STI Structure", M. Nishighori et al, 1996, IEDM.

Different approaches are known which try to cope with certain problems introduced by the interface between the active-area of a transistor and in particular the problems introduced due to the high electric field at the corner of the trench next to the active area. By means of introducing a high doping concentration near the corners of the active area this problem can be overcome, as described in U.S. Patent Application, application Ser. No. 08/788,065, entitled "Threshold voltage tailoring of corner MOSFET device", filed on Jan. 23, 1997 and presently assigned to the assignee of the instant application. Another way of suppressing the leakage caused at sharp corners of the trench is addressed in U.S. Pat. 5,567,553, entitled "Method to suppress subthreshold leakage due to sharp isolation corners in submicron FET structures", assigned to the assignee of the instant application. Yet another approach is described and claimed in U.S. Pat. No. 5,521,422, entitled "Corner protected shallow trench isolation devices", also assigned to the assignee of the instant application. Another way of solving the problems caused by the usually sharp corners of a trench situated next to an active area is discussed in U.S. Pat. No. 5,643,822, filed Jul. 22, 1996, entitled "Improved Trench Isolated FET Device and Method For Their Manufacture" which is assigned to the assignee of the present application.

It is a disadvantage of known structures employing trench isolation for the purpose of isolation of adjacent active devices (e.g. transistors), that the device-off current (in particular for array transistors) is relatively high.

It is an object of the present invention to provide new structures, and in particular CMOS structures, which have a reduced device off-current.

It is an object of the present invention to provide new structures, and in particular CMOS structures, with improved performance and reliability.

It is another object to provide new structures, and in particular CMOS structures, which can be easily made.

Still other objects and advantages of the invention will in part be obvious and will in part be apparent from the specification.

SUMMARY OF THE INVENTION

The above and other objects, which will be apparent to those skilled in art, are achieved in the present invention which is directed in a first aspect to trenches with sloped sidewalls and the use of such trenches for insulation of adjacent circuits in semiconductor devices. The reduction in sidewall slope is leads to a reduced device off-current. It is an advantage that the inventive structures can be made using processing steps which are compatible with current semiconductor manufacturing processes. Mainly the lithography steps need to be modified to provide an asymmetric masks used for the definition of the asymmetric structure of the FET (an exemplary method for making an asymmetric mask is described later). It is another advantage of the present invention that a sloped sidewall can be formed at selected locations along the active area/trench interface, where required for reduction of the corner parasitic leakage current. Other advantages of the inventive structures are discussed in connection with the embodiments.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
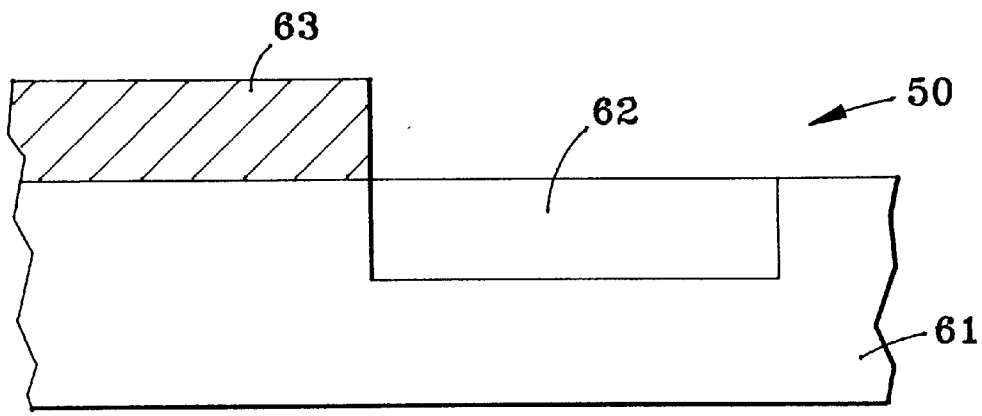
FIG. 1 shows a cross-sectional view of a mask and an and an asymmetric resist formed by using said mask.
Figure 1:
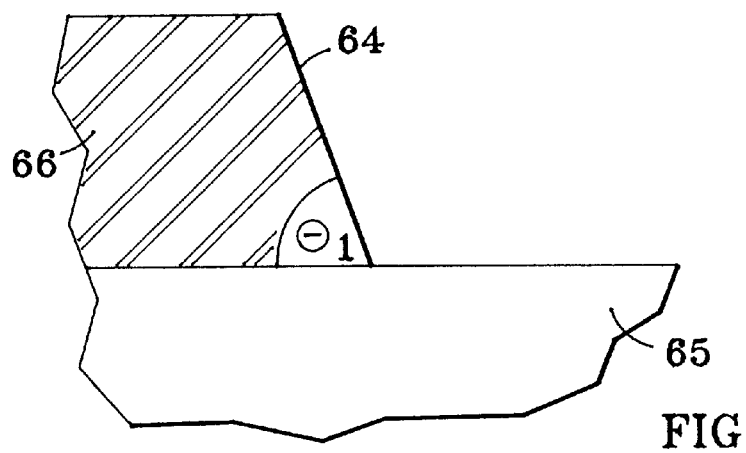

In describing the preferred embodiments of the present invention, reference will be made herein to FIGS. 1–9 of the drawings in which like numerals refer to like features of the invention. Features of the invention are not necessarily shown to scale in the drawings.

Polysilicon (also referred to as polycrystalline silicon) can be formed using chemical vapor deposition (CVD), or low pressure chemical vapor deposition (LPCVD), as well as other known processes. Polysilicon is a solid composed of a myriad of small single crystal regions.

Figure 2:
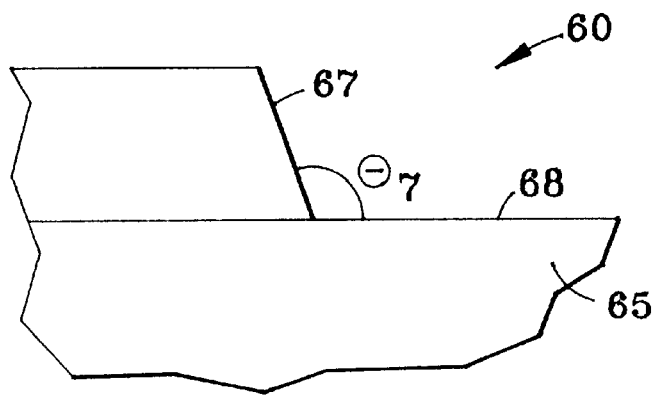
FIG. 2 shows a cross-sectional view of substrate in which a trench with a sloped sidewall has been formed using an asymmetric mask as the one shown in FIG. 1, for example.
Figure 3A:
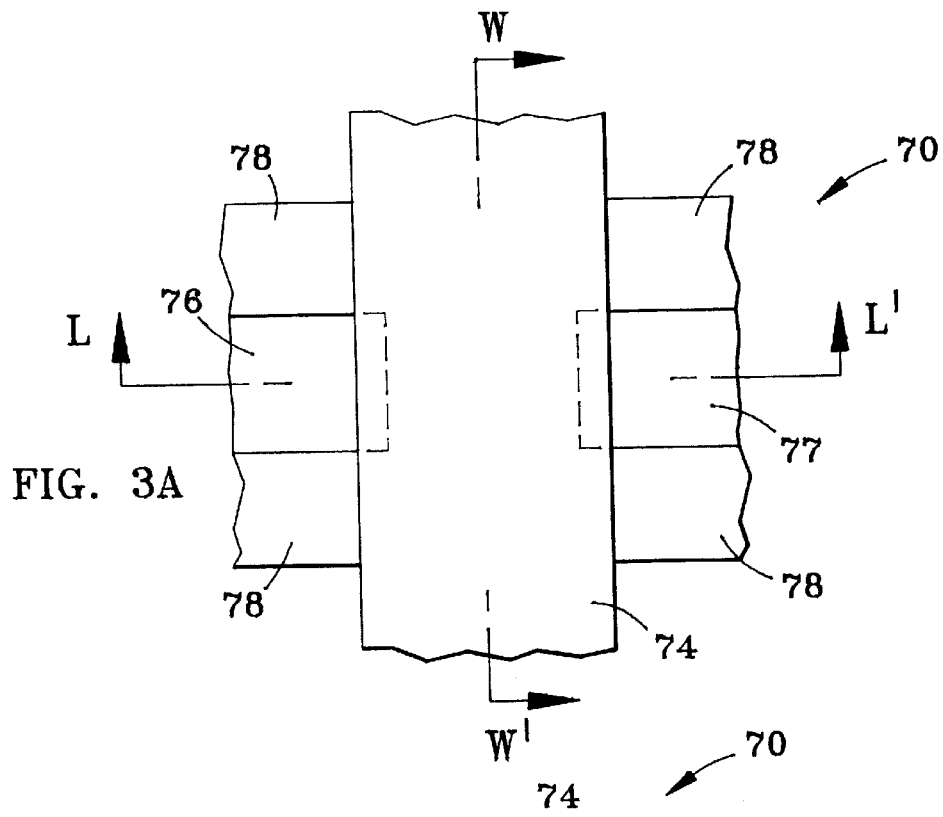
FIG. 3A shows a top-view of a CMOS or MOS transistor, according to the present invention.
Figure 3B:
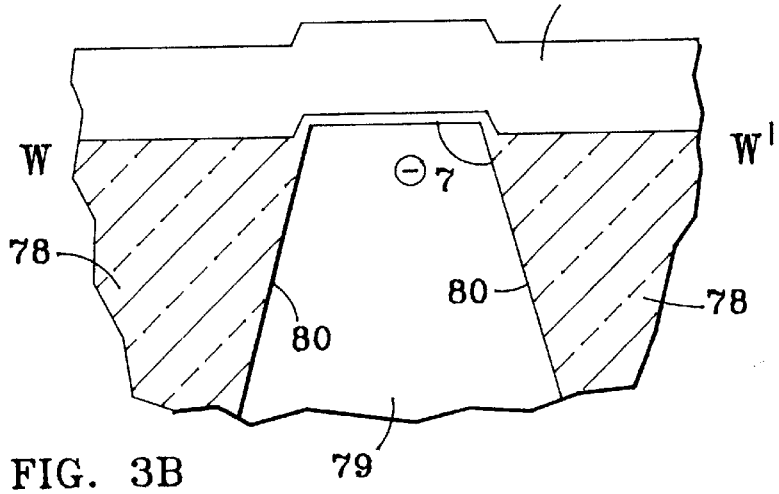
FIG. 3B shows a cross-sectional view of the CMOS or MOS transistor of FIG. 3A, along line W–W'. The trenches adjacent to the active area have sloped sidewalls, according to the present invention.
Figure 3C:
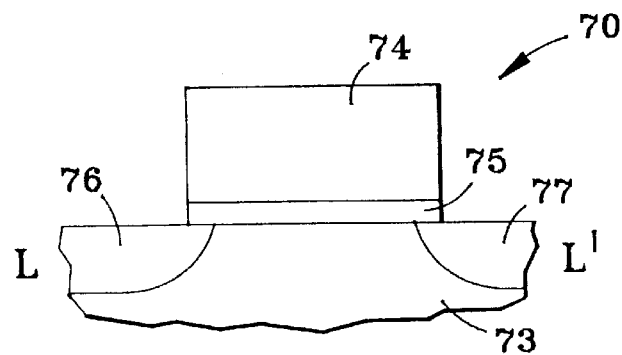
FIG. 3C shows a cross-sectional view of the CMOS or MOS transistor of FIG. 3A, along line L–L'.

FIGS. 1 and 2 together with FIGS. 4–8 are used to describe how the inventive structure shown in FIGS. 3A–3C can be made.

In FIG. 1, a cross section of special mask 50 is shown. This mask has a substrate 61 (e.g. glass), a chrome line 63 and a window 62 which was etched away. By etching away a certain thickness of the substrate 61 adjacent to the chrome 63, the phase shift of the light penetrating through the mask 50 can be controlled. Details of such masks and the use thereof are described in connection with FIGS. 4–8.

It is an important aspect of such a special mask 50, that it can be used to produce an asymmetric resist pattern 66 by means of a phase shift caused by the masks edge(s). In the bottom most part of FIG. 1, an example of such an asymmetric resist 66 is shown.

This resist is formed on top of a semiconductor structure 65, e.g. a semiconductor substrate. The asymmetric resist 66 has a sloped sidewall 64. The angle θ1 is between 90° and 30°, and preferably between 90° and 45°.

The asymmetric shape of the resist 66 can be transferred into the semiconductor structure 65 during a subsequent etch step, as shown in FIG. 2. Preferably, a reactive ion etch (RIE) step is used to transfer the resist shape into the semiconductor structure. The semiconductor structure 60 (see FIG. 2), after having carried out the etch step and after removal of said resist 66, has a trench with a sloped sidewall 67 and a bottom surface 68. The angle between the sloped sidewall 67 and the bottom surface 68 is θ7. The angle θ7 is between 90° and 150°, and preferably between 90° and 135°. (180°−θ1) may be equal to θ7. It is an advantage of the special mask and the method described later, that trenches can be made where one sidewall is sloped and other sidewalls are vertical or almost vertical (Please note that in FIG. 2 only one sidewall is shown). I.e., according to the present invention, a sloped sidewall can be formed at selected locations along the active area/trench interface, where required for reduction of the corner parasitic leakage current.

In FIG. 3A a schematic top view of an embodiment of the present invention is illustrated. Shown is a field effect transistor's 70 top metallization, namely the gate conductor 74. Furthermore, the drain implantation 77 and source implantation 76 are visible. The transistor is on two sides enclosed by trenches 78 filled with an isolating material.

As can be seen in cross section along line W–W' (see FIG. 3B), the active area 79 of the transistor 70 is bounded by two trenches 78 having sloped sidewalls 80. Due to the fact that trenches with sloped sidewalls 80 are employed, the angle θ7 is larger than in case of vertical sidewalls and thus the off-current is reduced compared to conventional devices. This in turn allows to reduce the well (active area 79) doping which translates into improved device electrical characteristics, most notably reduced junction leakage, improved reliability and performance.

The cross section along line L–L' is illustrated in FIG. 3C. In this Figure, the essential elements of the transistor 70 can be seen. The transistor comprises a gate conductor 74, a gate oxide 75, a source implantation 76 and a drain implantation 77. These implantations a formed in a substrate 73. Usually, other transistors are situated adjacent to the one shown. To isolate those adjacent devices, if needed, trenches are employed. Trenches parallel to the L'L' line will have conventional vertical sidewalls, whereas the trenches parallel to the W–W' line may have sloped sidewalls, as illustrated in FIG. 3B.

It is to be noted that the method described below allows to make trenches which have a sloped sidewall only underneath the gate conductor, for example.

In the present embodiment the following materials are used: polysilicon gate electrode 74; silicon dioxide gate oxide 75; silicon substrate 73; and n-doped source region 76, and drain region 77. Well suited as dopants are P, As and Sb, for example, or any combination thereof. Instead of n-doping the source and drain regions they may be p-doped using B, In or Ga, for example, or any combination thereof.

The trenches 78 may be either deep (between 0.5 $\mu$m and 3 $\mu$m deep) or shallow (between 0.1 $\mu$m and 0.5 $\mu$m deep) trenches. They may be filled with an insulating material such as $SiO_2$ for example.

Figure 9:
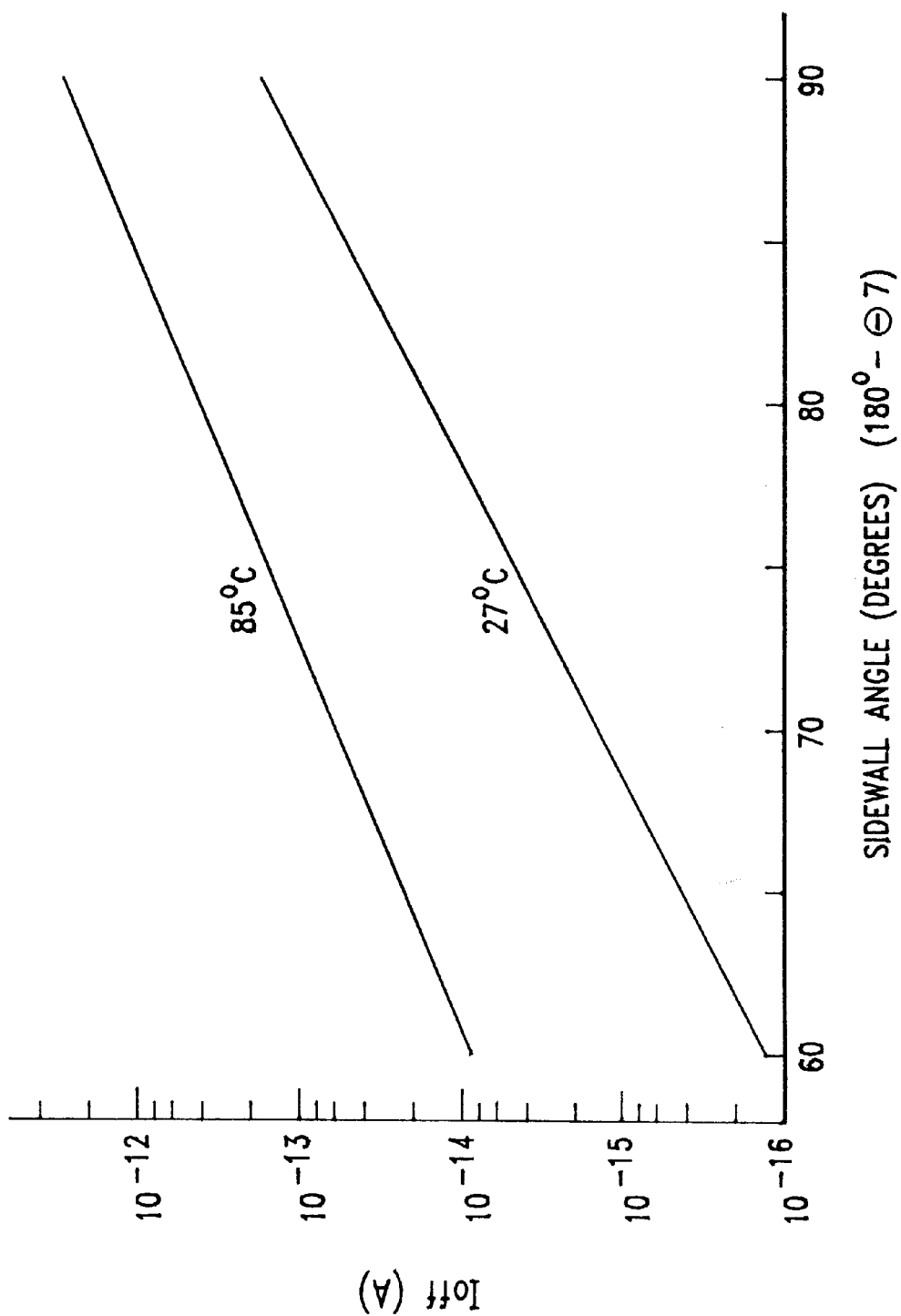
FIG. 9 shows the dependence of the device off-current Ioff on the angle of the trench's sidewall. (Please note that in FIG. 9 the sidewall angle $\theta 8=180°-\theta 7$).

The angle θ7 is between 90° and 150°, and preferably between 90° and 135°. The off-current of the transistor 70 has been found to be very sensitive to the sidewall angle of the area close to the transistor's active area 79. FIG. 9 shows the dependence of the device-off current on the sidewall slope. Modelling has shown that the device off-current decreases by typically a factor of 10 for every 10° increase in slope, for a 0.5 $\mu$m wide device. Sensitivity to sidewall angle is even greater for narrower devices, as used in DRAM arrays. If the sidewall angle θ7 is larger than 90°, the transistor's off-current is reduced. Generally, the off-current gets smaller with increasing sidewall angle θ7. This in turn allows to use lower doping concentrations in the transistor's channel region 79 (active area). The lower doping of the active area translates into improved device electrical characteristics and device performance. Most notably, the junction leakage in the FET 70 is reduced and thus the retention time is increased in a DRAM array, for example. Furthermore, the increased sidewall angle results in an improved device reliability mainly because of the reduction in the corner electric field which improves the gate dielectric reliability. An additional effect of increasing the sidewall angle is the reduction of channel hot-electron degradation due to the decreased corner field. In the article "Anomalous Hot-carrier Induced Degradation in Very Narrow Channel nMOSFETs with STI Structure", M. Nishighori et al, 1996, IEDM, it is shown for the first time that the high field at the sidewall's edge results in accelerated hot-electron degradation. The employment of a sloped sidewall close to the active region, according to the present invention, reduces this corner hot-electron problem.

Recently there have been a surge of research activities on SOI devices due to their applicability to low-power, high-speed VLSI, and due to many advantages that they exhibit over devices built on bulk semiconductor substrates. The advantages include 1) less junction capacitance so higher circuit speed can be achieved: 2) better device isolation and free from latchup; and 3) radiation hardness which is especially important for single event upset (SEU) sensitive memory applications.

The present invention can also be used in connection with silicon on insulator (SOI) devices.

As becomes apparent when reading the sections relating to the use of phase shift mask (see the part of the specification referring to FIGS. 4–8), one can select where to realize sloped sidewalls and where to realize vertical sidewalls. This is of particular importance when high packing densities are to be achieved.

Now that the basic building block—a trench isolation with sloped sidewall—and an embodiment of the present invention has been addressed, different other semiconductor devices can easily be realized employing such improved trench isolation wherever deemed appropriate. Such improved trench isolation can be used in any SOI device, in MOS and CMOS devices, DRAMs, logic devices, static random access memories, non-volatile memories, and so forth.

The masks employed for making the inventive structures can be used in any optical lithography system known in the art. These systems may also be termed projection imaginary systems and a typical system is described in U.S. Pat. No. 5,300,786, supra, where a photolithography mask structure having a novel optical focus test pattern is used to project test patterns on a resist coated semiconductor. Basically, these systems utilize an illumination source typically comprising a mirror, an arc lamp, a light filter and a condenser lens system. The illumination source outputs light to a mask structure which is pre-patterned as desired, e.g., to project a wiring level of an integrated circuit under fabrication. As used herein, the term light refers to light used in photolithography. The terms light and photolithography in the specification need not be restricted to visible light but can also embrace other forms of radiation and lithography. Light passing through the mask structure typically intersects a reduction lens which focuses the mask pattern into particular lens fields fabricated on the semiconductor wafer. The wafer is held in position by a vacuum hold device (or chuck) the position of which is controlled by an accurate X, Y, Z location controller or stepper motor.

Focus is typically quantified as an offset error in the location of the wafer in the Z dimension relative to a perfectly focused image plane. For purposes of the subject invention, the image plane can be at any point, e.g., typically either the top of the resist material or the base of the resist material or any point in between. The image plane may also be above the top of the resist or below the base of the resist.

The focus offset or defocus, as discussed hereinbelow, has either a positive or a negative Z displacement with respect to the ideal focal image plane along with a magnitude representative of the distance by which the image plane is out of focus. The vacuum hold device will typically be adjusted to provide the desired defocus to perform the method suited for making the structures according to the present invention. Another projection exposure apparatus which is generally used for pattern formation using a mask is shown in FIG. 9 of U.S. Pat. No. 5,370,975, supra.

To determine the best defocus to use to make the desired asymmetric resist sidewall, it is preferred to use a defocus matrix test procedure as part of the electronic component manufacturing process. Thus, a wafer having multiple chips thereon is coated with the photoresist, each chip exposed using a different defocus condition, then baked and developed using typical procedures. Each chip cross-section is then viewed across the resist sidewall with a scanning electron microscope (SEM) to determine the best defocus condition. For example, if the wafer has ten (10) chips, the defocus for each chip could be made to vary in the following sequence: $-1.0\ \mu m$, $-0.8\ \mu m$, $-0.6\ \mu m$, $-0.4\ \mu m$, $-0.2\ \mu m$, $0\ \mu m$, $+0.2\ \mu m$, $+0.4\ \mu m$, $+0.6\ \mu m$, $+0.8\ \mu m$. Other sequences could be used depending on the manufacturing process.

Figure 5:
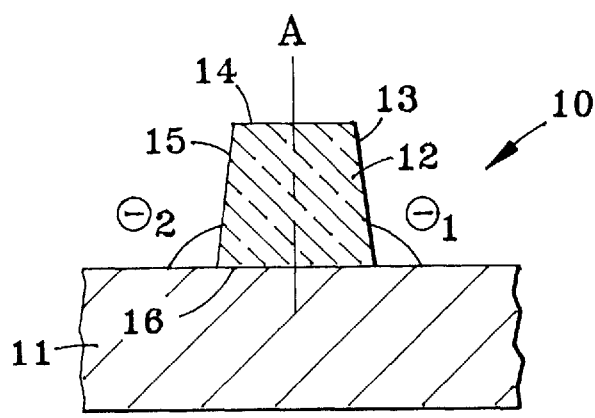
FIG. 5 shows a cross-sectional view of a substrate having a symmetric resist pattern formed thereon by the prior art.

Referring to FIG. 5, a substrate is shown containing a patterned resist generally as 10 and comprises a substrate 11 having the patterned resist 12 thereon. The patterned resist would be typically formed by exposing a substrate having a resist completely coated thereon with an exposure process and then developing the exposed resist to remove the unwanted resist and to form the pattern 12 shown in FIG. 5. The resist 12 is shown having sidewalls 13 and 15 and top 14 and base 16. A vertical axis intersecting the midpoint of the base 16 divides the resist pattern in half showing a symmetrical resist pattern. Accordingly, angles $\theta 1$ and $\theta 2$ are essentially equal.

As is well-known in the art, light exposure conditions, the type resist, bake and develop and reflection from the wafer surface will affect the shape of the resist pattern 12 but, in any event, the resist will be substantially symmetric about vertical axis A. For example, angles $\theta 1$ and $\theta 2$ while substantially equal may vary slightly depending on the above parameters. In some cases, $\theta 1$ and $\theta 2$ will be 90° forming a resist 12 having a constant cross-section from the base of the resist to the top of the resist. In FIG. 5 the cross section is shown to get smaller going from the base of the resist pattern to the top of the resist pattern.

Figure 4:
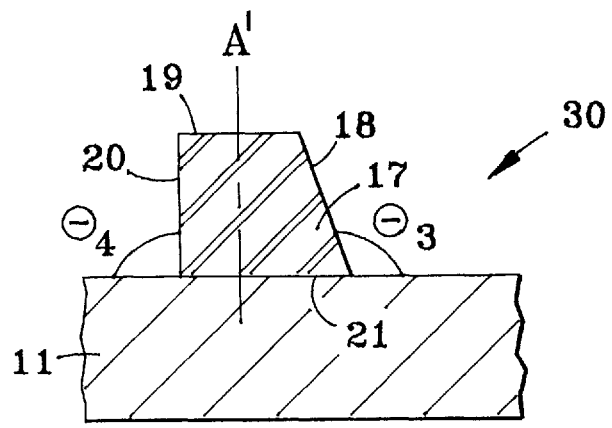
FIG. 4 shows a cross-sectional view of a substrate having an asymmetric resist formed thereon using a mask and method of the invention.

Using the mask and method described in the following, a resist shown generally as 30 in FIG. 4 may be formed. Accordingly, a substrate 11 is completely coated with a photoresist (not shown), exposed and developed to form a resist pattern 17 having sidewalls 18 and 20, a base 21 and top 19. The formed resist pattern 17 has sidewall angles $\theta 3$ and $\theta 4$. The resist 17 is asymmetric about vertical axis A' which axis bisects the base 21 of resist 17. Accordingly, angle $\theta 3$ is greater than $\theta 4$. Comparing FIGS. 4 and 5, it can be seen that the symmetric resist pattern 12 of the prior art (FIG. 5) is different from the asymmetric resist pattern 17 made using the mask and method described in the following.

Figure 6:
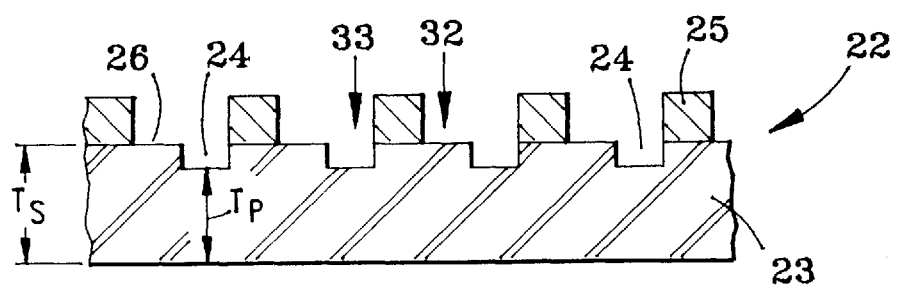
FIG. 6 shows a cross-sectional view of a mask of the invention used to form a plurality of parallel asymmetric resist patterns on a substrate.

Referring to FIG. 6, a mask is shown generally as 22. The mask 22 comprises a transparent substrate 23 having a thickness Ts. The substrate 23 has light shielding material 25 thereon in the form of parallel lines. Contiguous with each light shielding material 25 is a channel 24 which, in effect, reduces the thickness of substrate 23 as represented by Tp. The thickness of the substrate Ts is therefore greater than the thickness of the substrate at channel 24 (Tp) and light transmitted through mask 22 has a different phase on each side 32 and 33 of light shielding material 25. The mask may be generally described as having light shielding areas 25 between areas providing a difference in phase for the light passing through the mask. More specifically, for a line mask as shown in FIG. 6, the mask comprises from left to right, a repeating pattern of phase shift means 24, light shielding means 25 and substrate 23 having a surface 26. As is well-known to those skilled in art, other methods may be used to change the phase of the light transmitted through the mask 22 such as the use of a phase shifter material such as Spin On Glass in place of the channel 24.

Figure 7A:
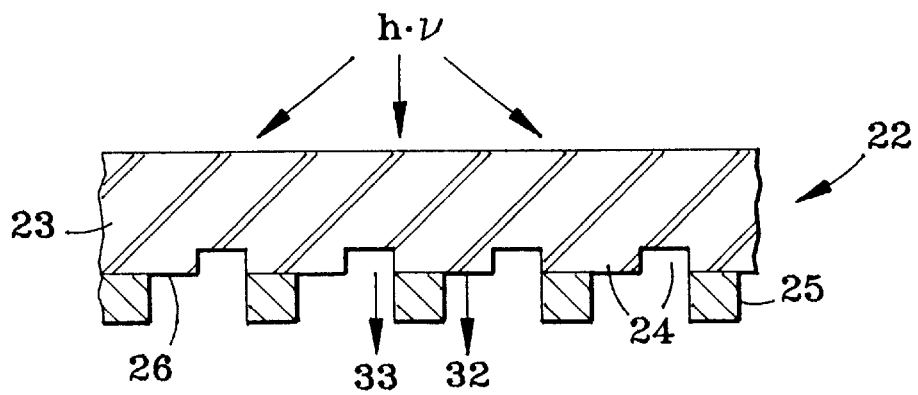
FIG. 7a shows a cross-section of a mask of the invention and FIGS. 7b and 7c show cross-sectional views of a resist pattern having asymmetric sidewalls made with a positive resist on a substrate using the mask and method of the invention.
Figure 7B:
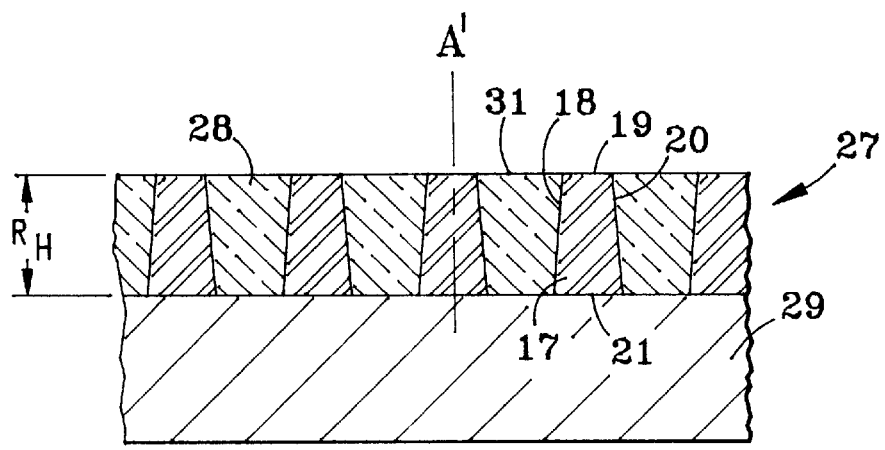
Figure 7C:
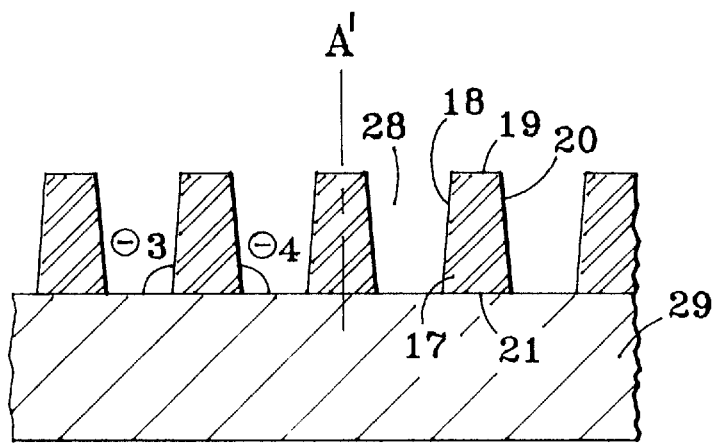

Referring to FIGS. 7A, 7B and 7C a method is shown for using such masks to form a substrate having an asymmetric resist pattern formed thereon. In FIG. 7A light is shown impinging on mask 22 of the invention which comprises a transparent substrate 23 having light shielding lines 25 thereon with contiguous channel areas 24 on one side of the light shielding material in a repeating pattern to form a phase shift of the light so that the phase of the light traveling through mask 22 is different on each side 32 and 33 of light shielding material 25.

FIG. 7B shows a semiconductor structure generally as 27 comprising a substrate 29 coated with a positive photoresist material 31. Resist patterns 17 are formed having sidewalls 18 and 20 and base 21 and top 19. The exposed resist is shown as 28 and when developed is soluble and would be removed forming the resist pattern substrate shown in FIG. 7C. As can be seen from FIG. 7C, angle θ3 is greater than angle θ4 forming an asymmetric resist pattern 17 having asymmetric sidewalls 18 and 20. A vertical line A' bisecting base 21 of resist pattern 17 shows an asymmetric cross-section of the resist over the height of the resist. The resist is skewed on the side of the light shielding material having the phase shift means. The intensity profile of the light through the mask of the invention at the top of the resist in FIG. 7B is slightly asymmetric about midpoint A'. The asymmetric of the light intensity profile about midpoint A' is more pronounced at the base of the resist due to the finite thickness of the resist. A prior art mask (non-phase shift mask) would have a symmetric intensity profile which is substantially the same at the top of the resist and at the base of the resist.

Referring again to FIG. 6, a typical mask 22 of the invention is shown. The transparent material 23 may be any suitable transparent material such as glass, calcium fluoride and fused silica and is typically fused silica. The thickness of the substrate Ts will generally be about 90 mils to 300 mils. It is preferred to form the phase shift of the light passing through the mask by employing channels 24 in the substrate 23 which effects a phase shift of the light by its travel through a different substrate thickness (Ts versus Tp). The necessary thickness for a desired phase shift can be early determined. The difference between the phases of the light passing through the mask substrate at 32 and the opposed side 33 of light shielding material 25 must be other than 0° or 180°, or multiples thereof. In a highly preferred embodiment, it is preferred that the difference in phase of the light be 90°. Thus, the light passing through point 32 is the transmitted light from the exposure apparatus and the light passing through point 33 is phase shifted 90° or any other desired angle other than 0° or 180°, or multiples thereof.

The light shielding material 25 may be any suitable material such as molybdenum silicide and chrome and is typically chrome which is applied using conventional means such as sputtering or metal evaporation, preferably sputtering. The thickness of the light shielding material may vary widely and is generally about 50 nm to 150 nm. The purpose of the light shielding material 25 is to prevent light from passing through the mask where the material 25 is present onto the resist coated substrate being imaged.

Referring again to FIG. 7B, the substrate 29 is typically silicon or other semiconductor material and the resist material may be any photoresist such as a negative resist or a positive resist. While any resist may be used, it is preferred that the resolution of the resist be a medium or high resolution resist as is well-known in the art.

It is important that the resist, thickness of the resist, the difference in phase of the light on each side of the light shielding material, the focus and light exposure dose during exposure be specially controlled either singly or preferably in combination to provide the desired asymmetric resist patterns. Each of the above parameters may be varied independently but are all preferably controlled within certain ranges to provide enhanced resist patterning results.

Any resist thickness may be employed, but it is preferred that greater thicknesses be used to provide a greater asymmetric resist pattern effect. The resist thickness will generally be about 0.1 μm to 10 μm and is preferably about 0.4 μm to 2 μm. The defocus may also vary widely and is generally greater than the thickness of the resist, generally up to about ±10 μm and preferably about ±1 μm. Also preferred is a positive defocus rather than a negative defocus. The exposure dose may be chosen to be such that the width of the printed line is substantially equal to the width of the corresponding mask pattern. For example, for a 5× stepper, a 2.0 μm mask feature will print a 0.4 μm width line. This is conventionally called dose to size and preferably, a dose of about 0.7 to 1.5 times the dose to size is preferred.

The illumination condition of the projection exposure tool should provide a coherency of about 0.25 to 0.8 preferably 0.6 or less. Referring to FIG. 7A showing a mask and FIGS. 7B and 7C showing the exposed resist, a resist pattern was formed using a 365 nm (i-line) light with a 90° phase shift on one side of a 240 nm structure wafer dimensions in a positive tone resist of 0.85 μm thickness. A defocus of about −0.2 μm resulted in a substantially 90° profile on one side of the resist Q4 and a 95° profile on the other wall of the resist pattern Q3.

Figure 8A:
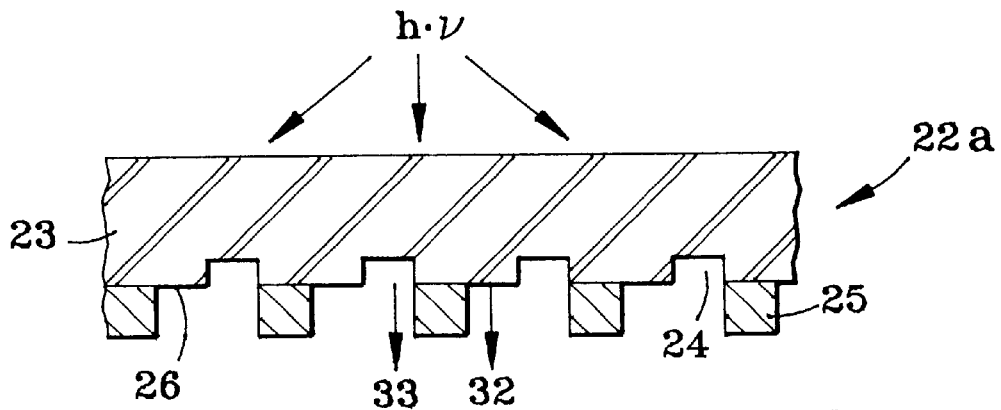
FIG. 8a shows a cross-section of a mask of the invention and FIGS. 8b and 8c show cross-sectional views of a resist pattern having asymmetric sidewalls made with a negative resist on a substrate using the mask and method of the invention.
Figure 8B:
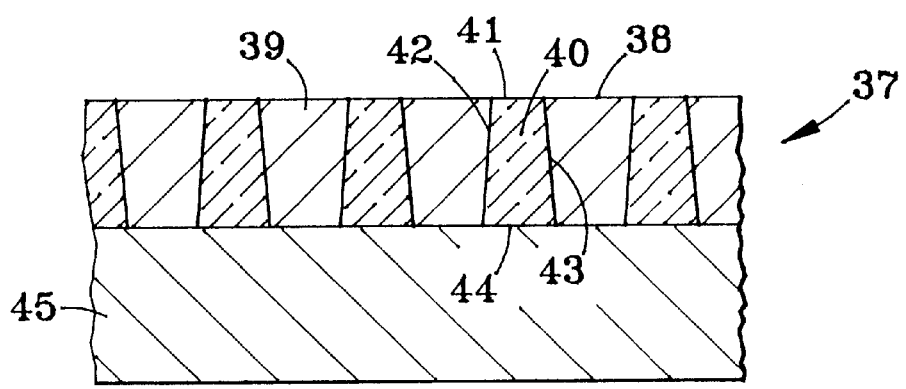
Figure 8C:
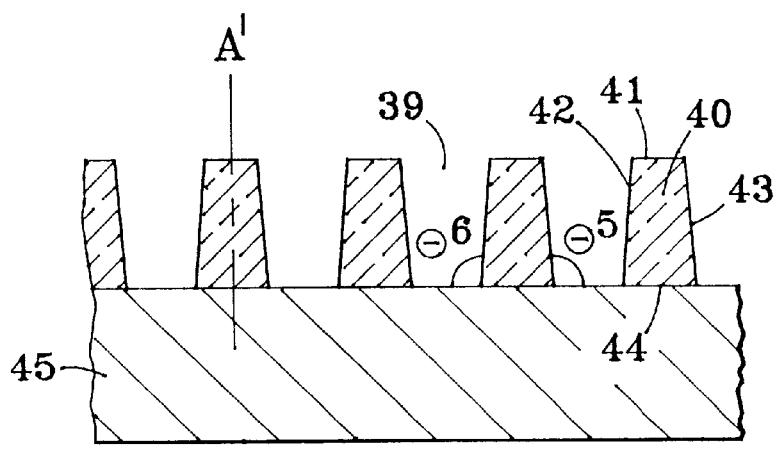

Referring to FIGS. 8A, 8B and 8C, a mask and method is described which is suited to pattern a substrate coated with a negative resists. In FIG. 8A, mask 22a comprises a transparent substrate 23, light shielding members 26 and phase shifter channels 24. The surface of the substrate is shown as 26. Light passing through the mask is shown passing through the substrate without any phase shift as 32 and passing through channel 24 and being phase shifted as 33.

In FIG. 8B, a substrate 45 coated with a negative resist 38 shown generally as 37 is exposed to light and position 40 is made insoluble and the part not exposed to light 39, remains soluble. Exposed resist 40 has sidewalls 42 and 43, a base 44 and top 41. After developing as shown in FIG. 8C, soluble resist 39 is removed leaving negative resist 40. Angle θ5 is greater than angle θ6 forming an asymmetric resist pattern 40 as shown by vertical axis A'. As discussed above for FIGS. 7A, 7B and 7C, the phase shift mask produces an asymmetric light intensity profile on the resist and an asymmetric resist pattern. Non-phase shift masks would produce a symmetric light intensity profile and a symmetric resist pattern.

Using an asymmetric resist as described above, one can make the inventive trench structures with sloped sidewalls, as was discussed above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Method of making a semiconductor device, comprising:
   depositing a photoresist on a semiconductor substrate having a major dimension in a horizontal plane;
   patterning said photoresist with a phase-shifting mask having a line and at least two phase-shifting portions, one on each side of said line, said phase-shifting portions being so located relative to said line to produce a developed photoresist line pattern having sidewalls sloped at an angle between 75 and 30 degrees away from said major dimension as determined by controllable parameters of said phase-shifting portions;
   transferring said developed photoresist line pattern to said semiconductor substrate to define an active area for a semiconductor device having straight sidewalls sloped at an angle between 105 and 150 degrees away from said major dimension;

filling trenches remaining from defining said active area with an isolation material;

forming source, drain, and channel regions in said active area between said trenches; and forming a gate stack over said channel region, said gate stack being oriented transversely to sidewalls of said trenches.

2. Method of making a semiconductor device, comprising:

depositing a photoresist on a semiconductor substrate having a major dimension in a horizontal plane;

patterning said photoresist with a phase-shifting mask having a line and at least one phase-shifting portion adjacent to said line, said phase-shifting portion being so located relative to said line to produce a developed photoresist line pattern having at least one sidewall sloped at an angle between 75 and 30 degrees away from said major dimension as determined by controllable parameters of said phase-shifting portion;

transferring said developed photoresist line pattern to said semiconductor substrate to define an active area for a semiconductor device having at least one straight sidewall sloped at an angle between 105 and 150 degrees away from said major dimension;

filling trenches remaining from defining said active area with an isolation material;

forming source, drain, and channel regions in said active area between said trenches; and forming a gate stack over said channel region, said gate stack being oriented transversely to sidewalls of said trenches.

3. The method of claim 2 wherein said line has only said one phase-shifting portion located relative thereto so as to produce a developed photoresist line pattern having said one sidewall sloped at an angle between 75 and 30 degrees and having another straight sidewall sloped at another angle between 90 and 75 degrees.

4. The method of claim 3 wherein said controllable parameters include etch depth of said phase-shifting portions.

* * * * *